(12) United States Patent
Chang et al.

(10) Patent No.: US 10,631,445 B2
(45) Date of Patent: Apr. 21, 2020

(54) ELECTRONIC ASSEMBLY WITH RFI SHIELDING

(71) Applicants: Chin-Hsien Chang, Taipei (TW); Shang-Chu Chien, Taipei (TW); Ting-Tuan Chang, Taipei (TW); Chi-Chu Chen, Taipei (TW)

(72) Inventors: Chin-Hsien Chang, Taipei (TW); Shang-Chu Chien, Taipei (TW); Ting-Tuan Chang, Taipei (TW); Chi-Chu Chen, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 15/847,947

(22) Filed: Dec. 20, 2017

(65) Prior Publication Data

US 2018/0310441 A1 Oct. 25, 2018

Related U.S. Application Data

(60) Provisional application No. 62/487,487, filed on Apr. 20, 2017.

(30) Foreign Application Priority Data

Oct. 13, 2017 (TW) .............................. 106135222 A

(51) Int. Cl.
*H05K 9/00* (2006.01)
*H05K 1/02* (2006.01)
*G06F 1/16* (2006.01)

(52) U.S. Cl.
CPC ......... *H05K 9/0024* (2013.01); *G06F 1/1656* (2013.01); *G06F 1/1675* (2013.01);
(Continued)

(58) Field of Classification Search
CPC ............... H05K 9/0024; H05K 1/0243; H05K 2201/10159; H05K 2201/10189; H05K 2201/10371
See application file for complete search history.

(56) References Cited

U.S. PATENT DOCUMENTS 6,278,610 B1 * 8/2001 Yasufuku ............. H05K 7/1431
165/185
7,501,587 B2 * 3/2009 English ............... H05K 9/0032
174/354

FOREIGN PATENT DOCUMENTS

CN 1302096 7/2001
TW M323796 12/2007
(Continued)

OTHER PUBLICATIONS

"Office Action of Taiwan Counterpart Application," dated Jun. 26, 2018, pp. 1-5.

*Primary Examiner* — Jayprakash N Gandhi
*Assistant Examiner* — Hung Q Dang
(74) *Attorney, Agent, or Firm* — JCIPRNET

(57) ABSTRACT

An electronic assembly with RFI shielding including a circuit board, a high frequency electromagnetic radiation device, and a shielding cover is provided. The circuit board includes a connector. The high frequency electromagnetic radiation device is detachably inserted to the connector of the circuit board to be electrically connected with the circuit board. The shielding cover is detachably assembled to the connector to be opened or closed relative to the circuit board. The shielding cover shields high frequency radiation generated by the high frequency electromagnetic radiation device when the shielding cover is in a closed state, and at least a portion of the shielding cover contacts the circuit
(Continued)

board in the closed state, and the shielding cover is electrically connected to a grounding portion of the circuit board via the connector.

6 Claims, 5 Drawing Sheets

(52) U.S. Cl.
CPC ......... *H05K 1/0243* (2013.01); *H05K 9/0032* (2013.01); *H05K 1/0215* (2013.01); *H05K 2201/10159* (2013.01); *H05K 2201/10189* (2013.01); *H05K 2201/10371* (2013.01); *H05K 2201/2018* (2013.01)

(56) References Cited

FOREIGN PATENT DOCUMENTS

| TW | I314434 | 9/2009 |
| TW | 201345405 | 11/2013 |
| TW | M559046 | 4/2018 |

* cited by examiner

ELECTRONIC ASSEMBLY WITH RFI SHIELDING

CROSS-REFERENCE TO RELATED APPLICATION

This application claims the priority benefits of U.S. provisional application Ser. No. 62/487,487, filed on Apr. 20, 2017 and Taiwan application serial no. 106135222, filed on Oct. 13, 2017. The entirety of each of the above-mentioned patent applications is hereby incorporated by reference herein and made a part of this specification.

BACKGROUND OF THE INVENTION

1. Field of the Invention

The invention relates to an electronic assembly, and particularly relates to an electronic assembly with radio frequency interference (RFI) shielding.

2. Description of Related Art

With the blooming development of electronic and information industries, the use of various electronic information products has become more and more popular. Under the trend of being more light-weighted, compact, slim, and smaller in size, various broadband noises are generated from undesired voltages or currents in various internal systems of the electronic information products. Such noises significantly influence various device functions and the ability of receiving wireless signals (e.g., LTE or WLAN signals) of the system. These noises are generally referred to as radio frequency interference (RFI). Nowadays, various countries among the world have launched electromagnetic compatibility (EMC) control and set forth standards against electromagnetic interference for electromechanical and electronic products, industrial and scientific products, communication products, and medical products, so as to ensure that the electromagnetic interference generated by electronic information products does not affect the operation of other products and that the products are capable of operating against external interference in a suitable electromagnetic environment.

In the field of computers, a common issue is that strong high frequency electromagnetic radiation in a frequency band around 1.5 GHz to 3 GHz is generated during rapid and frequency reading and writing of memories. The issue becomes much more significant as the demand for the speed and capacity of memories increases.

Some technologies have been proposed to cope with high-frequency electromagnetic radiation. For example, Taiwan Utility Model Patent No. M323796 discloses an electromagnetic shielding structure including a frame body soldered on a circuit board and a cover body disposed on the frame body. The structure is configured to provide electromagnetic shielding for the electronic components disposed therein.

However, such configuration requires a corresponding frame body designed beforehand for the electronic components to be shielded. Therefore, different frame bodies and cover bodies are required for different cases, making the generality and applicability of such configuration undesirable. Besides, the frame body needs to be soldered to be connected with the circuit board, so an additional manufacturing process is required. Besides, the process may require modification as the shape of the frame body and the area taken by the frame body on the circuit board change. Therefore, such configuration requires a more complicated manufacturing process, and is unable to render a higher yield rate.

Based on the above, how to provide a simple structure to avoid the electromagnetic radiation caused by rapid and frequent reading and writing of memories while making the structure more general applicable and more efficient to manufacture has become an issue for relevant researchers to work on.

SUMMARY OF THE INVENTION

The invention provides an electronic assembly with radio frequency interference (RFI) shielding. In the electronic assembly, an integrally formed shielding cover is detachably assembled to a connector of a circuit board, so as to provide electromagnetic radiation shielding for a high frequency electromagnetic radiation device inserted to the connector.

An embodiment of the invention provides an electronic assembly with RFI shielding including a circuit board, a high frequency electromagnetic radiation device, and a shielding cover. The circuit board includes a connector. The high frequency electromagnetic radiation device is inserted to the connector to be opened or closed relative to the circuit board. The shielding cover shields high frequency electromagnetic radiation generated by the high frequency electromagnetic radiation device, at least a portion of the shielding cover contacts the circuit board in the closed state, and the shielding cover s electrically connected to a grounding portion of the circuit board via the connector.

According to an embodiment of the invention, the high frequency electromagnetic radiation device is a double data rate synchronous dynamic random access memory (DDR SDRAM).

According to an embodiment of the invention, when the shielding cover is in the closed state relative to the circuit board, a relative distance is kept between a bottom edge of the shielding cover and the circuit board, and the relative distance is less than or equal to 0.5 mm.

According to an embodiment of the invention, the shielding cover includes a first cover body and a second cover body, the first cover body is detachably assembled to the connector and shields the connector, and the second cover body is pivoted to the first cover body to be opened or closed relative to the circuit board.

According to an embodiment of the invention, the connector has at least one protruding ear, the first cover body has at least one opening, and the protruding ear is engaged to the opening to assemble the first cover body to the connector.

According to an embodiment of the invention, the first cover body is electrically connected to the grounding portion of the circuit board via engagement of the opening and the protruding ear.

According to an embodiment of the invention, when the second cover body is in a closed state relative to the circuit board, a relative distance is kept between a bottom edge of the second cover body and the circuit board, and the relative distance is less than or equal to 0.5 mm.

According to an embodiment of the invention, the first cover body has a guiding pillar, the second cover body has a reaming slot, and the guiding pillar is movably pivoted to the reaming slot, so that the second cover body is slidable and pivotally rotatable relative to the first cover body.

Based on the above, the shielding cover is detachably assembled to the connector on the circuit board of the electronic assembly to be opened or closed relative to the circuit board. Therefore, in the closed state of the shielding cover relative to the circuit board, the shielding cover is able to completely cover the high frequency electromagnetic radiation device on the connector to shield the high frequency electromagnetic radiation generated by the high frequency electromagnetic radiation device. In the configuration, the integrally formed shielding cover is directly engaged with the connector to effectively simplify the component structure providing high frequency electromagnetic shielding of the electronic components on the circuit board. Besides, since the shielding cover may be attached to or detached from the connector, the user is able to more conveniently use the shielding cover.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
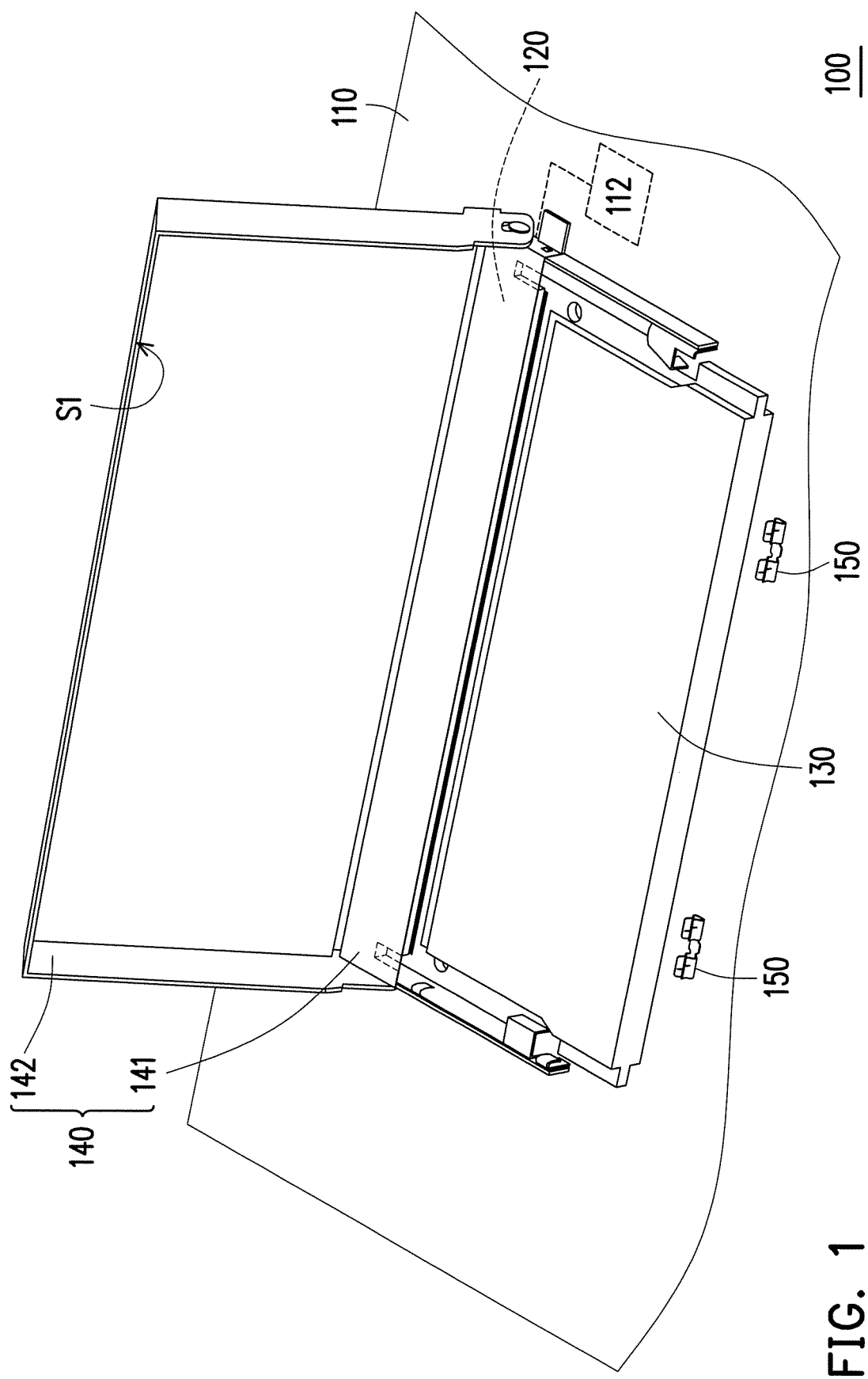
FIG. 1 is a schematic view illustrating an electronic assembly according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
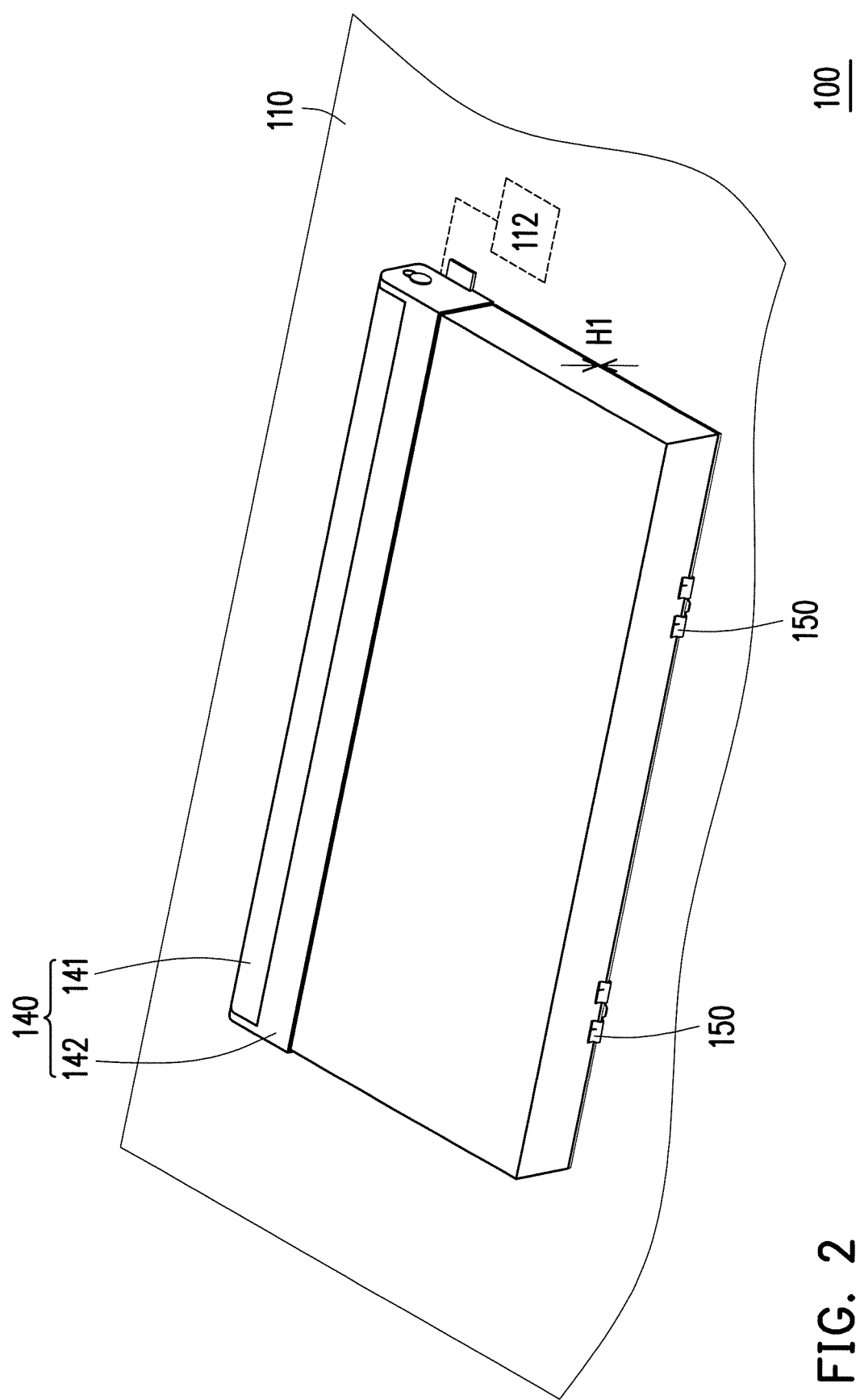
FIG. 2 is a schematic view illustrating another state of the electronic assembly of FIG. 1.
Figure 3:
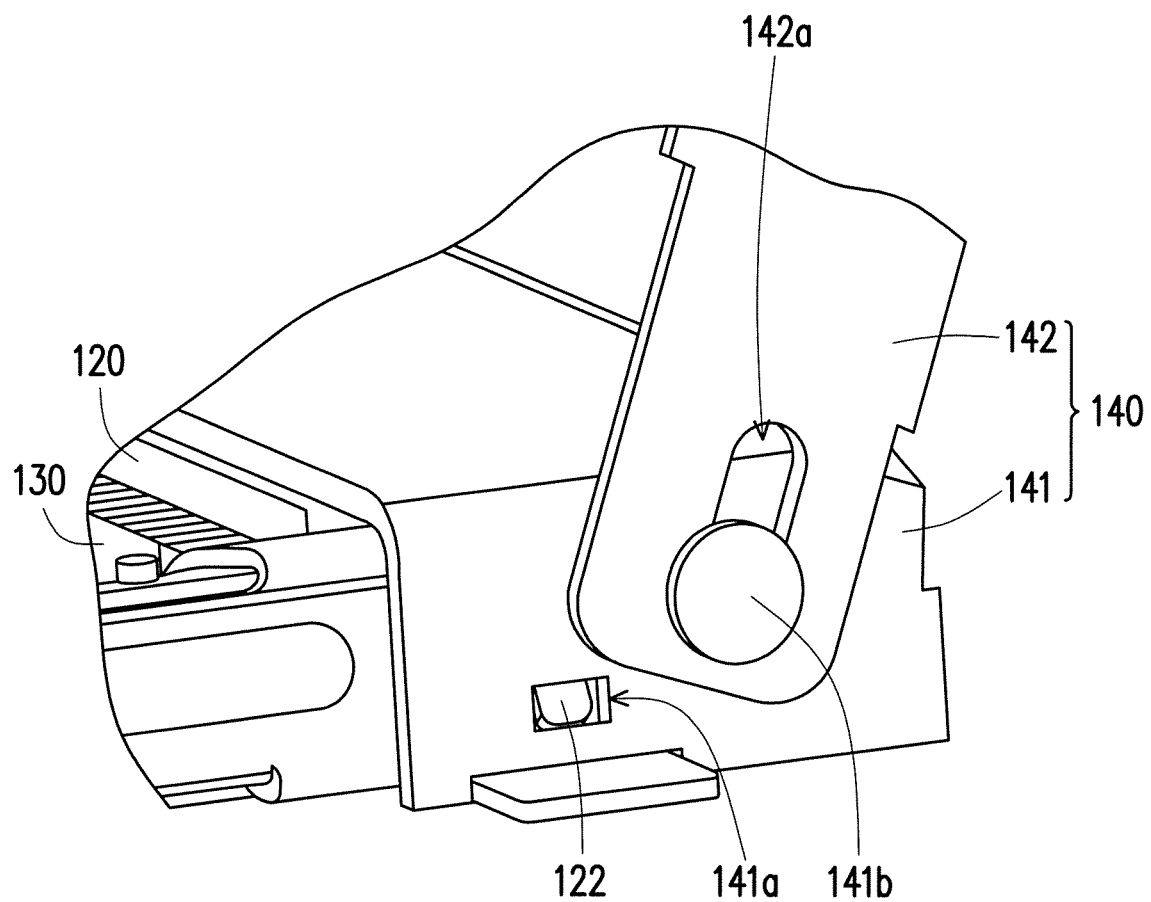
FIG. 3 is a partial enlarged view of the electronic assembly of FIG. 1.

FIG. 1 is a schematic view illustrating an electronic assembly according to an embodiment of the invention. FIG. 2 is a schematic view illustrating another state of the electronic assembly of FIG. 1. FIG. 3 is a partial enlarged view of the electronic assembly of FIG. 1. Referring to FIGS. 1 to 3, in the embodiment, an electronic assembly 100 includes a circuit board 110, a connector 120 disposed on the circuit board 110, a high frequency electromagnetic radiation device 130, and a shielding cover 140. The circuit board 110 is a motherboard of a computer apparatus, for example, and the high frequency electromagnetic radiation device 130 is a double data rate synchronous dynamic random access memory (DDR SDRAM), for example. The high frequency electromagnetic radiation device 130 is inserted to the connector 120 to be electrically connected with the circuit board 110. During operation of a memory, high frequency electromagnetic radiation (e.g., ranging around 1.5 GHz to 3 GHz) may be generated, and such electromagnetic radiation may easily affect other electronic components on the circuit board 110 or electronic apparatuses near the circuit board 110. Accordingly, in the embodiment, the shielding cover 140 is detachably assembled to the connector 120 to be opened or closed relative to the circuit board 110. Hence, the shielding cover 140 is able to shield the high frequency electromagnetic radiation generated by the high frequency electromagnetic radiation device 130 when the shielding cover 140 is in a closed state relative to the circuit board 110 (as shown in FIG. 2)

More specifically, the shielding cover 140 of the embodiment is substantially an integrally formed component and includes a first cover body 141 and a second cover body 142. The first cover body 141 is detachably assembled to the connector 120 and shields the connector 120, whereas the second cover body 142 is pivoted to the first cover body 141 and is able to be opened or closed relative to the circuit board 110 after the first cover body 141 is assembled to the connector 120.

Figure 4:
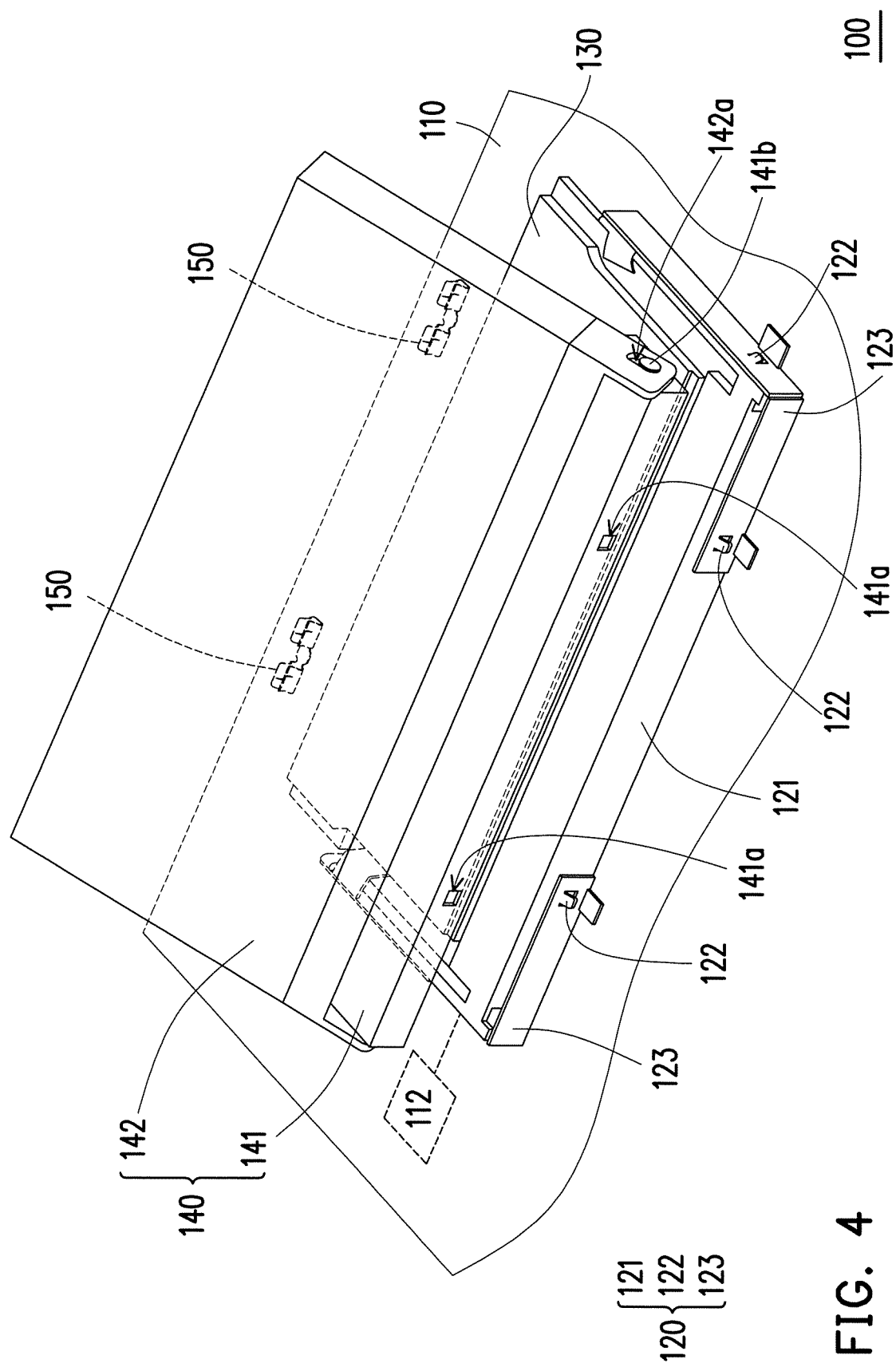
FIG. 4 is an exploded view of the electronic assembly of FIG. 1.

FIG. 4 is an exploded view of the electronic assembly of FIG. 1. Referring to FIGS. 3 and 4, the connector 120 of the embodiment includes a trough body 121 and a frame 123 disposed on a periphery of the trough body 121. In addition, a protruding ear 122 is formed on the frame 123 and extends away from the trough body 121. The trough body 121 and the frame 123 are integrally formed by, for example, in-mold injection. In other words, a material of the frame 123 includes metal, and the frame 123 as well as an electrical connection sheet (not shown) in the trough body 121 may be respectively formed at an inner part and an outer part of the trough body 121. In addition, the protruding ear 122 is formed by partially punching and bending the frame 123, for example. Correspondingly, the first cover body 141 has an opening 141a. When the first cover body 141 is lowered to cover the connector 120 as shown in FIG. 4, the protruding ear 122 of the connector 120 may be pressed by the first cover body 141 and elastically deformed. When the first cover body 141 completely covers the connector 120, the protruding ear 122 is elastically restored and engaged with the opening 141a, as shown in FIG. 3, so as to complete assembling of the first cover body 141 and the connector 120. At this time, the first cover body 141 substantially shields the connector 120, and the second cover body 142 may be driven to be opened or closed relative to the circuit board 110.

However, the invention does not intend to limit how the protruding ear 122 and the opening 141a are formed, the numbers of the protruding ear 122 and the opening 141a, and the profiles and shapes of the protruding ear 122 and the opening 141a. In an embodiment not shown herein, a bendable elastic sheet may be formed on the periphery of the trough body 121 to achieve a similar engagement with the opening 141a. Besides, while four protruding ears 122 are disposed at three different sides of the trough body 121 in the embodiment, the designer may still suitably modify the number and location of the protruding ear based on an assembling condition of the connector 120 and the shielding cover 140.

Besides, referring to FIGS. 1, 2, and 4, in the embodiment, a grounding portion 112 is further disposed on the circuit board 110. The grounding portion 112 is electrically connected with the frame 123 (including a metallic material described above) of the connector 120. Thus, the first cover body 141 is electrically connected with the grounding portion 112 of the circuit board 110 via engagement of the opening 141a and the protruding ear 122, thereby grounding the shielding cover 140.

Referring to FIGS. 1 and 2, in the embodiment, the electronic assembly 110 further includes a fastener 150 disposed on the circuit board 110. With the fastener 150, the cover body 142 may be fastened to the fastener 150 when the second cover body 142 is in a closed state relative to the circuit board 110. In other words, a bottom edge S1 is pressed against the fastener 150 to maintain the closed state. In another embodiment, the second cover body 142 may also include a conductive material, and the fastener 150 may also be electrically connected with the grounding portion 112 of the circuit board 110. Accordingly, the shielding cover 140 may be electrically connected with the grounding portion 112 via contacting of the second cover body 142 and the fastener 150.

As shown in FIG. 2, when the shielding cover 140 is in the closed state relative to the circuit board 110, a relative distance H1 is kept between the bottom edge S1 (shown in FIG. 1) of the second cover body 142 and the circuit board 110. In addition, the relative distance H1 may be less than or equal to 0.5 mm, preferably greater than or equal to 0.01 mm. With the relative distance H1, at least a portion of the bottom edge S1 of the shielding cover 140 structurally contacts the circuit board 110 to ensure air ventilation and consequently heat dissipation in addition to shielding the high frequency electromagnetic radiation generated by the high frequency electromagnetic radiation device 130. By optimizing the relative distance H1 (i.e., 0.01 mm≤H1≤0.5 mm), a balance is struck between effects of electromagnetic radiation shielding and heat dissipation. Besides, such configuration also provides a tolerance to assemble the structure among the shielding cover 140, the connector 120, and the circuit board 110. In other words, the manufacturing tolerance and the assembling tolerance of these components may be accommodated.

It should be noted that, while only FIG. 1 illustrates the bottom edge S1 of the second cover body 142 of the embodiment, the relative distance H1 may be respectively kept between the first cover body 141 or the second cover body 142 of the shielding cover 140 and the circuit board 110 to achieve the aforementioned effects. In other words, the bottom edge of the first cover body 141 is able to keep the relative distance H1 relative to the circuit board 110 when the first cover body 141 is assembled to the connector, and the bottom edge S1 of the second cover body 142 is able to keep the relative distance H1 relative to the circuit board 110 by resorting to the thickness of the fastener 150.

In addition, with the relative distance H1, a gap area is formed between the bottom edge of the shielding cover 140 and the circuit board 110. In other words, when observing the state of the electronic assembly 100 shown in FIG. 2 from a top perspective, the connector 120 and the high frequency electromagnetic radiation device 130 is completely covered and encapsulated by the shielding cover 140. At this time, both the first cover body 141 and the second cover body 142 of the shielding cover 140 keep the relative distance H1. Therefore, the gap areas are formed between the four side surfaces (each of the side surfaces being substantially orthogonal to the circuit board 110) of the shielding cover 140 and the circuit board 110 except where the fastener 150 is arranged and where the shielding cover 140 and the circuit board 110 are in physical or structural contact. Thus, the designer may suitably adjust the relative distance H1 at different positions based on the gap areas at the four side surfaces. In other words, as long as a total of the gap areas between the shielding cover 140 and the circuit board 110 (the total of the gap areas at the four side surfaces in the case of the embodiment, preferably 109 mm$^2$) is controlled, the designer is able to adjust or modify the relative distance H1 based on the needs. Meanwhile, the relative distance H1 is not affected by the shapes and profiles of the shielding cover 140, the connector 120, and the high frequency electromagnetic radiation device 130. When the shielding cover 140 does not have a rectangular profile surrounding the connector 120 and the high frequency electromagnetic radiation device 130 shown in FIG. 2, since the total of the gap areas to be a fixed value is controlled, the designer may still suitably adjust the relative distance H1 at different positions to cope with the assembling condition and needs for assembling the components. For example, when the shielding cover is pentagonal, there are five side surfaces. Nevertheless, the designer only needs to the control the total of the gap areas at the five side surfaces to be a fixed value, such as 109 mm$^2$, and the relative distance between the shielding cover and the circuit board 110 may be adjusted accordingly. Here, the total of the gap areas depends on an optimized state for the electromagnetic radiation shielding capability and the heat dissipation effect.

Figure 5:
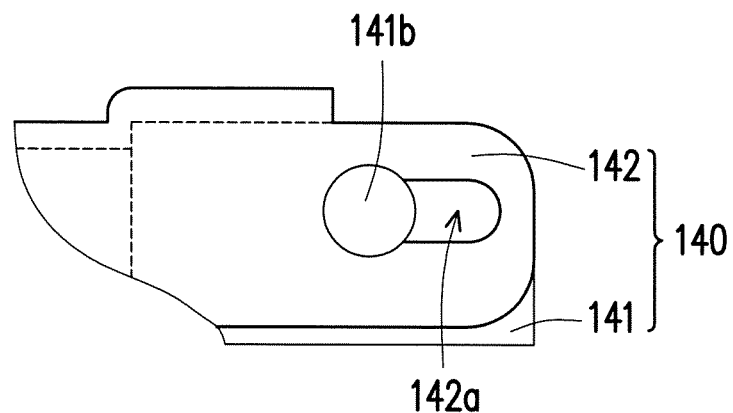
FIGS. 5 and 6 are respectively partial side views of an electronic assembly.
Figure 6:
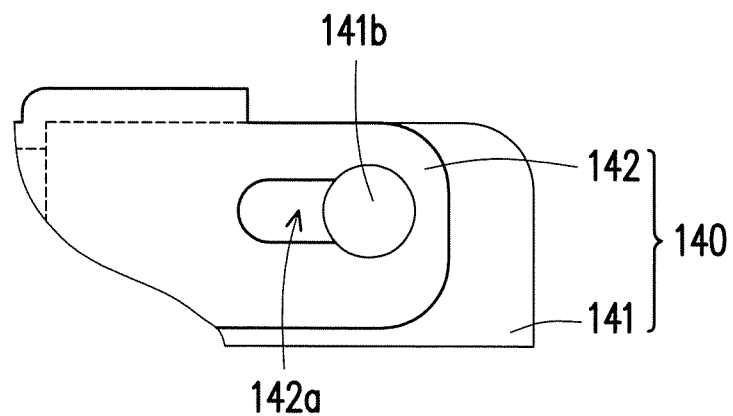

FIGS. 5 and 6 are respectively partial side views of an electronic assembly. Referring to FIGS. 5 and 6 and FIGS. 1 and 2, in the embodiment, the first cover body 141 further includes a guiding pillar 141b, and the second cover body 142 has a reaming slot 142a. The guiding pillar 141b may be movably pivoted to the reaming slot 142a, so that the second cover body 142 is slidable and pivotally rotatable relative to the first cover body 141. When the user intends to convert the shielding cover 140 from the closed state shown in FIG. 2 to the opened state shown in FIG. 1, the user may slide the second cover body 142 to convert the state shown in FIG. 5 to the state shown in FIG. 6, then the second cover body 142 may be lifted and pivotally rotated. Such configuration allows the shielding cover 140 to be thinner while still providing the desired shielding effect. Besides, the sliding and then pivotal rotation of the second cover body 142 allows the shielding cover 140 to be opened smoothly without interfering with the connector 120 or the high frequency electromagnetic radiation device 130.

In view of the foregoing, according to the embodiments of the invention, the shielding cover is detachably assembled to the connector on the circuit board of the electronic assembly to be opened or closed relative to the circuit board. Therefore, in the closed state of the shielding cover relative to the circuit board, the shielding cover is able to completely cover the high frequency electromagnetic radiation device on the connector to shield the high frequency electromagnetic radiation generated by the high frequency electromagnetic radiation device. In the configuration, the integrally formed shielding cover is directly engaged with the connector to effectively simplify the component structure providing high frequency electromagnetic shielding of the electronic components on the circuit board. Besides, since the shielding cover may be attached to or detached from the connector, the user is able to more conveniently use the shielding cover.

Furthermore, at least a portion of the bottom edge of the shielding cover contacts the circuit board in the closed state, and the relative distance and the gap area are formed between the periphery of the shielding cover and the circuit board. Thus, the designer is able to set the gap area by only considering the high frequency electromagnetic radiation generated by the electromagnetic radiation device and the needs for heat dissipation. The relative distance between the bottom edge of the shielding cover and the circuit board, the number of the fastener, and the location of the fastener may be suitably adjusted based on the condition of the surrounding without being limited by the shape and the profile of the shielding cover. Therefore, the generality and applicability in designing the electronic assembly are facilitated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic assembly with radio frequency interference (RFI) shielding, comprising:
   a circuit board, having a connector;
   a high frequency electromagnetic radiation device, detachably inserted to the connector and electrically connected to the circuit board; and
   a shielding cover, detachably connected to the connector to be opened in an open state or closed in a closed state relative to the circuit board, wherein the shielding cover shields high frequency electromagnetic radiation generated by the high frequency electromagnetic radiation device, at least a portion of the shielding cover contacts the circuit board in the closed state, and the shielding cover is electrically connected to a grounding portion of the circuit board via the connector,
   wherein the shielding cover comprises a first cover body and a second cover body, the first cover body is fixedly assembled to the connector and shields the connector, and a relative distance is kept between the first cover body and the circuit board,
   wherein the second cover body is pivoted to the first cover body to be opened in the open state or closed in the closed state relative to the circuit board, the first cover body has a guiding pillar, the second cover body has a reaming slot, and the guiding pillar is movably pivoted to the reaming slot, such that the second cover body is slidable and pivotally rotatable relative to the first cover body.

2. The electronic assembly with RFI shielding as claimed in claim 1, wherein the high frequency electromagnetic radiation device is a double data rate synchronous dynamic random access memory (DDR SDRAM).

3. The electronic assembly with RFI shielding as claimed in claim 1, wherein when the shielding cover is in the closed state relative to the circuit board, the relative distance is kept between a bottom edge of the shielding cover and the circuit board, and the relative distance is less than or equal to 0.5 mm.

4. The electronic assembly with RFI shielding as claimed in claim 1, wherein the connector has at least one protruding ear, the first cover body has at least one opening, and the protruding ear is engaged to the opening to assemble the first cover body to the connector.

5. The electronic assembly with RFI shielding as claimed in claim 4, wherein the first cover body is electrically connected to the grounding portion of the circuit board via engagement of the opening and the protruding ear.

6. The electronic assembly with RFI shielding as claimed in claim 1, wherein when the second cover body is in the closed state relative to the circuit board, the relative distance is kept between a bottom edge of the second cover body and the circuit board, and the relative distance is less than or equal to 0.5 mm.

* * * * *